US007881113B2

(12) United States Patent
Jones et al.

(10) Patent No.: US 7,881,113 B2
(45) Date of Patent: Feb. 1, 2011

(54) RELAXED METAL PITCH MEMORY ARCHITECTURES

(75) Inventors: Lyle D. Jones, Boise, ID (US); Roger W. Lindsay, Boise, ID (US); Kirk D. Prall, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 638 days.

(21) Appl. No.: 11/703,487

(22) Filed: Feb. 7, 2007

(65) Prior Publication Data

US 2008/0186777 A1    Aug. 7, 2008

(51) Int. Cl.
    *G11C 16/04*    (2006.01)
(52) U.S. Cl. .......................... 365/185.17; 365/185.05; 365/185.13; 365/185.26
(58) Field of Classification Search ............... 365/63, 365/185.17, 185.33, 185.05, 185.18, 185.13, 365/185.26
    See application file for complete search history.

(56) References Cited

U.S. PATENT DOCUMENTS

| 5,621,684 | A | * | 4/1997 | Jung | 365/185.17 |
| 5,909,392 | A | * | 6/1999 | Chang et al. | 365/185.12 |
| 7,177,191 | B2 | * | 2/2007 | Fasoli et al. | 365/185.17 |
| 7,221,588 | B2 | * | 5/2007 | Fasoli et al. | 365/185.17 |
| 7,365,018 | B2 | * | 4/2008 | Higashitani et al. | 438/717 |
| 7,436,709 | B2 | * | 10/2008 | Higashitani | 365/185.18 |

* cited by examiner

*Primary Examiner*—Pho M Luu
(74) *Attorney, Agent, or Firm*—Schwegman, Lundberg & Woessner, P.A.

(57) ABSTRACT

A relaxed metal pitch architecture may include a bit line and a first active area string and a second active area string. The bit line may be directly coupled to the first active area string and to the second active area string. The relaxed metal pitch architecture may be applied to a non-volatile memory structure.

31 Claims, 7 Drawing Sheets

RELAXED METAL PITCH MEMORY ARCHITECTURES

TECHNICAL FIELD

This disclosure relates generally to non-volatile memory semiconductor devices, including flash memory arrays.

BACKGROUND

Flash memory is non-volatile, which means that it stores information so that the memory does not need power to maintain the information. Flash memory data may be stored in floating gates (FGs), which are part of a field effect transistor (FET), and which gates are relatively isolated from other structures in a semiconductor device. The floating gates may be based on the floating-gate avalanche-injection metal oxide semiconductor (FAMOS transistor) which is essentially a complimentary metal oxide semiconductor (CMOS) FET that includes the FG isolated between the gate and source/drain terminals.

The pressure upon the microelectronic device fabricator to ever miniaturize, motivates reducing the size of back-end-of-line (BEOL) structures such as the metallization.

BRIEF DESCRIPTION OF THE DRAWINGS

The above mentioned issues are addressed by the present disclosure and will be understood by reading and studying the following specification, of which the Figures are a part.

DETAILED DESCRIPTION

Various embodiments relate to achieving read/write operations in non-volatile memory cells of flash memory arrays by using a reduced number of bit lines and bit contacts. Many embodiments therefore relate to relaxed-pitch metallization architectures of flash memory arrays.

Figure 1:
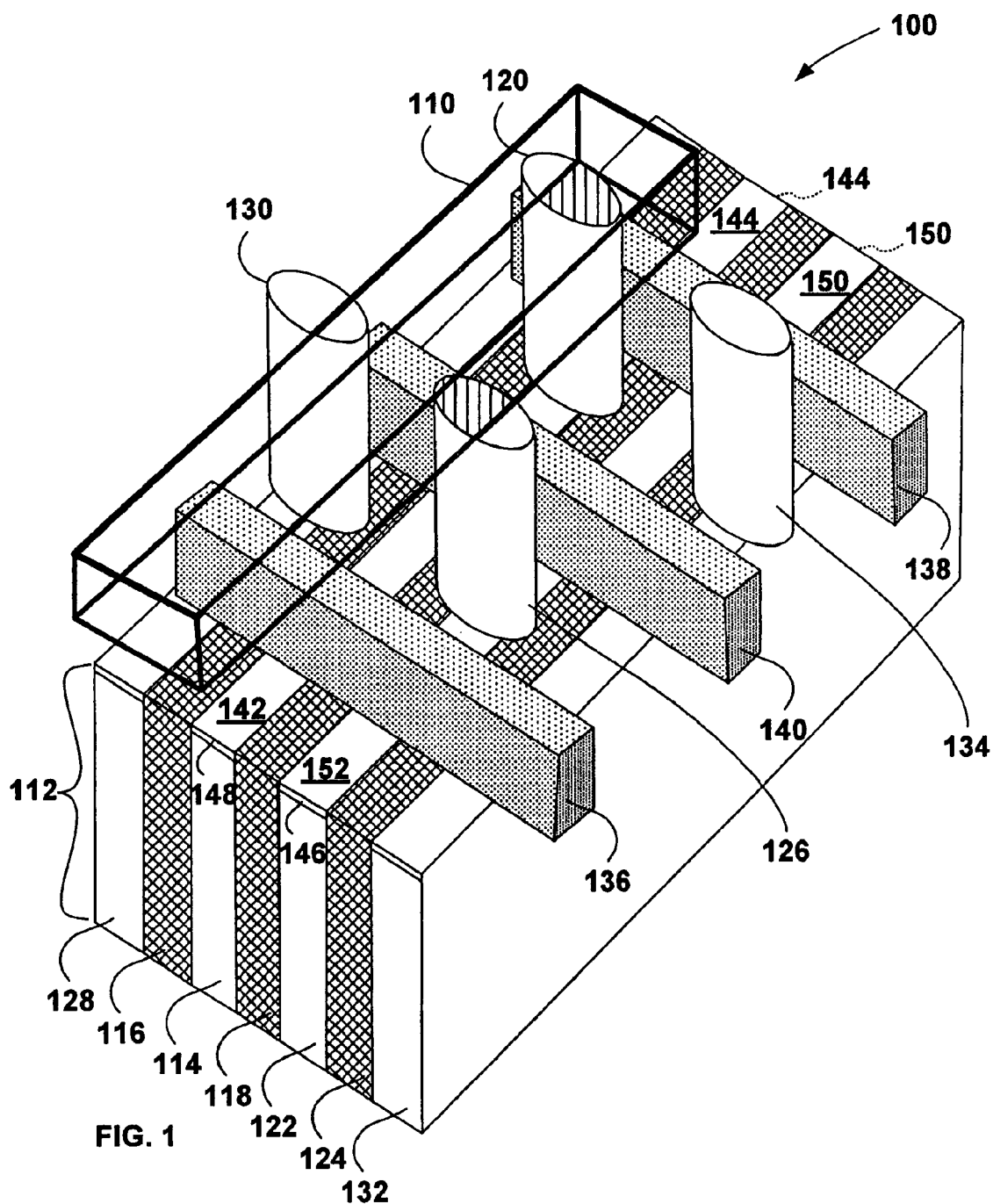
FIG. 1 is a cross-section and perspective elevation of a portion of a flash memory array according to an embodiment.

FIG. 1 is a cross-section and perspective elevation of a portion of a flash memory array 100 according to an embodiment. A bit line 110 is disposed above a semiconductor substrate 112. The bit line 110 is illustrated in wireframe to reveal structures behind and beneath it. The semiconductor substrate 112 includes semiconductive regions and non-semiconductive regions. A first active area string 114 is disposed between a first shallow-trench isolation (STI) 116 and an intermediate STI 118. The first active area string 114 communicates with the bit line 114 through a first contact 120. A second active area string 122 is disposed between the intermediate STI 118 and a second STI 124. The second active area string 122 communicates with the bit line 110 through a second contact 126. The bit line 110 contacts both the first active area string 114 and the second active area string 122, only through the respective first contact 120 and second contact 126. In other words, the bit line 110 makes contact with both the first active area string 114 and the second active area string 122. Also, it is the first contact 120 that contacts the first active area string 114, and it is the second contact 126 that contacts the second active area string 122.

An active area string 128 is spaced apart from the first active area string 114 by the first STI 116. This active area string 128 communicates through a contact 130. An active area string 132 is spaced apart from the second active area string 122 by the second STI 124. This active area string 132 communicates through a contact 134.

A first select gate 136 is disposed above the semiconductor substrate 112, and it crosses perpendicular to the first active area string 114 and the second active area string 122. A subsequent select gate 138 is also disposed above the semiconductor substrate 112, and it crosses perpendicular to the first active area string 114 and the second active area string 122. An intermediate select gate 140 is disposed above the semiconductor substrate 112, between the first select gate 136 and the subsequent select gate 138, and it also crosses perpendicular to the first active area string 114 and the second active area string 122. Word lines that are used to access the flash memory array 100 are disposed parallel to the select gates and peripheral to the illustrated portions of the flash memory array 100. The flash memory array 100 can be divided into a first side that has a boundary at the intermediate select gate 140 and is in the direction of the first select gate 136, and a second side that has a boundary also at the intermediate select gate 140 and is in the direction of the subsequent select gate 138.

In a process embodiment during fabrication of the flash memory array 100, the first active area string 114 may be processed to include a low threshold voltage region (LVTR) 142 and a HVTR (HVTR) 144. In an embodiment, formation of the LVTR 142 and the HVTR 144 may be accomplished by first forming a HVTR gate oxide layer 146, which is depicted with a dashed reference line because it has depth below the HVTR 144. The HVTR gate oxide layer 146 is blanket formed. Subsequently, selected portions of the HVTR gate oxide layer 146 may be masked and an etch may be carried out in the unmasked portions of the etch field, to thin the HVTR gate oxide layer 146 such that a lower-voltage gate oxide layer 148 is formed for the LVTR 142. A medium voltage threshold redoing (MVTR) is formed in a similar manner.

In an embodiment, the HVTR gate oxide layer 146 and the lower-voltage gate oxide layer 148 may be substantially equivalent in thickness, but the LVTR 142 and the HVTR 144 may be differently doped to allow induced semiconductance at different select gate voltages.

The second active area string 122 likewise depicts a LVTR 150 and a HVTR 152. In an embodiment, the HVTR 152 and the LVTR 150 may be prepared with the respective HVTR gate oxide layer 146 and lower-voltage gate oxide layer 148, which is depicted with a dashed reference line because it has depth below the HVTR 152. In an embodiment, the LVTR 150 and the HVTR 152 may be prepared by differently doping the respective accesses to allow a different threshold voltage.

In a method embodiment, the first active area string 114 is read at the LVTR 142. In this method embodiment, although the bit line 110 may be electrically coupled to the LVTR 142 and the HVTR 144 in the first active area string 114, and to the HVTR 152 and the LVTR 150 in the second active area string 122, the bit line 110 only reads the first active area string 114 at the LVTR 142. This method is accomplished by activating the requisite word line, activating the first select gate 136 at the requisite high voltage, and activating the intermediate select gate 140 at the requisite low voltage. The subsequent select gate 138 is not activated and consequently data cannot be extracted from either of the HVTR 144 nor LVTR 150. Data can be extracted, however, from the first active area string 114 at the LVTR 142. But data cannot be extracted from the second active area string 122 at the HVTR 152 because the intermediate select gate 140 was activated only at the requisite low voltage.

Figure 2:
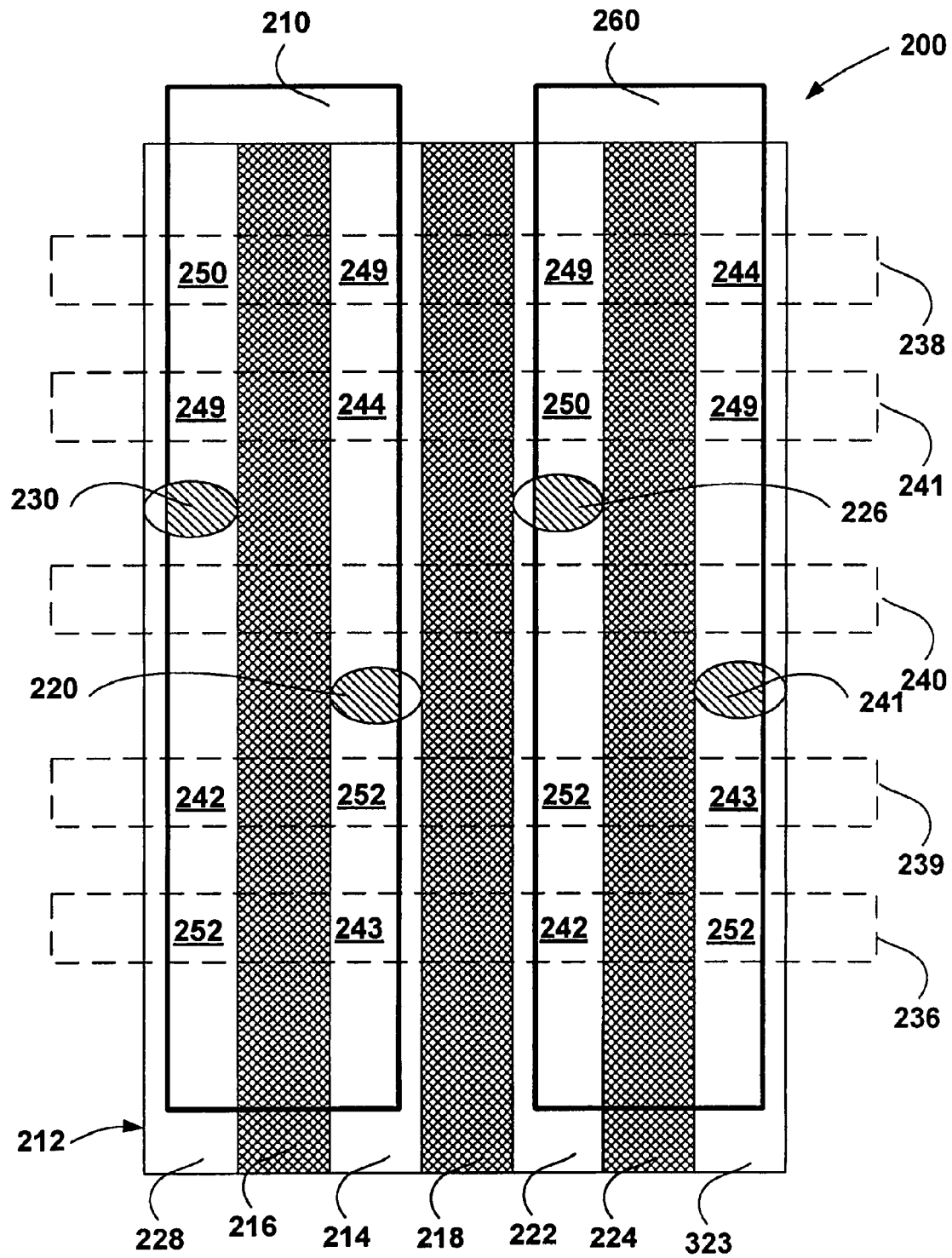
FIG. 2 is a top plan of a portion of a flash memory array according to an embodiment.

FIG. 2 is a top plan of a portion of a flash memory array 200 according to an embodiment. A first bit line 210 is disposed above a semiconductor substrate 212. The first bit line 210 is illustrated in wireframe to reveal structures beneath it. The semiconductor substrate 212 includes semiconductive regions and non-semiconductive regions. A first active area string 214 is disposed between a first STI 216 and an intermediate STI 218. The first active area string 214 communicates with the first bit line 210 through a first contact 220. An active area string 228 is spaced apart from the first active area string 214 by the first STI 216. This active area string 228 communicates through a contact 230 to the first bit line 210.

A second bit line 260 is also disposed above the semiconductor substrate 212 and is adjacent the first bit line 210. The second bit line 260 is illustrated in wireframe to reveal structures beneath it. In an embodiment, the second bit line 260 is used as a voltage reference during a read/write using the first bit line 210. A second active area string 222 is disposed between the intermediate STI 218 and a second STI 224. The second active area string 222 communicates with the first bit line 210 through a second contact 226. An active area string 232 is spaced apart from the second active area string 222 by the second STI 224. This active area string 232 communicates through a contact 234 to the second bit line 260.

A first select gate 236 is disposed above the semiconductor substrate 212, and crosses perpendicular to the first active area string 214 and the second active area string 222. All select gate structures depicted in FIG. 2 are illustrated as dashed lines for clarity. A subsequent select gate 238 is also disposed above the semiconductor substrate 212, and crosses perpendicular to the first active area string 214 and the second active area string 222. An intermediate select gate 240 is disposed above the semiconductor substrate 212, between the first select gate 236 and the subsequent select gate 238, and it also crosses perpendicular to the first active area string 214 and the second active area string 222. A fourth select gate 239 is disposed above the semiconductor substrate 212, between the first select gate 236 and the subsequent select gate 238, and it also crosses perpendicular to the first active area string 214 and the second active area string 222. A fifth select gate 241 is disposed above the semiconductor substrate 212, between the subsequent select gate 238 and the subsequent select gate 238, and it also crosses perpendicular to the first active area string 214 and the second active area string 222. Word lines that are used to access the flash memory array 200 are disposed parallel to the select gates and peripheral to the illustrated portions of the flash memory array 200.

The first active area string 214 and the second active area string 222 are processed to include various occurrences of HVTR 252 and 244, MVTR 243 and 249, and LVTR 242 and 250. In an embodiment, formation of the LVTR 242 and 250, the MVTR 243 and 249, and the HVTR 252 and 244 is accomplished by first forming a HVTR gate oxide layer. The HVTR gate oxide layer is blanket formed. Subsequently, selected portions of the HVTR gate oxide layer is masked and a first etch is carried out in the unmasked spaces to thin the HVTR gate oxide layer such that a MVTR gate oxide layer is formed for the MVTR 243 and 249. Subsequently, the HVTR 252 and 244 and the MVTR 243 and 249 are masked and a subsequent etch is carried out in the unmasked spaces to thin the gate oxide layer such that the LVTR 242 and 250 are formed.

In an embodiment, the gate oxide is not thinned, but the respective high- medium- and LVTR 252 and 244, 243 and 249, and 242 and 250, respectively, are differently doped to allow induced semiconductance at different select gate voltages. In a method embodiment, the active area string 228 may be read at the MVTR 243. In this method embodiment, although the first bit line 210 may be electrically coupled to eight voltage accesses, the first bit line 210 only reads the active area string 228 at the MVTR 243. This method may begin by activating the requisite word line and the intermediate select gate 240. Also, the first select gate 236 may be activated at the medium voltage, and the fourth select gate 239 may be activated at the requisite low voltage. The subsequent select gate 238 and the fifth select gate 241 are not activated and consequently none of the LVTR 250, MVTR 249, or HVTR 244 are able to give up their data. The active area string 228, however, gives up its information at the MVTR 243. But the first active area string 214 cannot give up its information according to an embodiment data at the MVTR 243 because the fourth select gate 239 is activated only at the requisite low voltage and consequently, data cannot flow to the first contact 220. Data can only flow to the contact 230 from the active area string 228 and not the first active area string 214 because the fourth select gate 239 was activated at the requisite low voltage.

Figure 3:
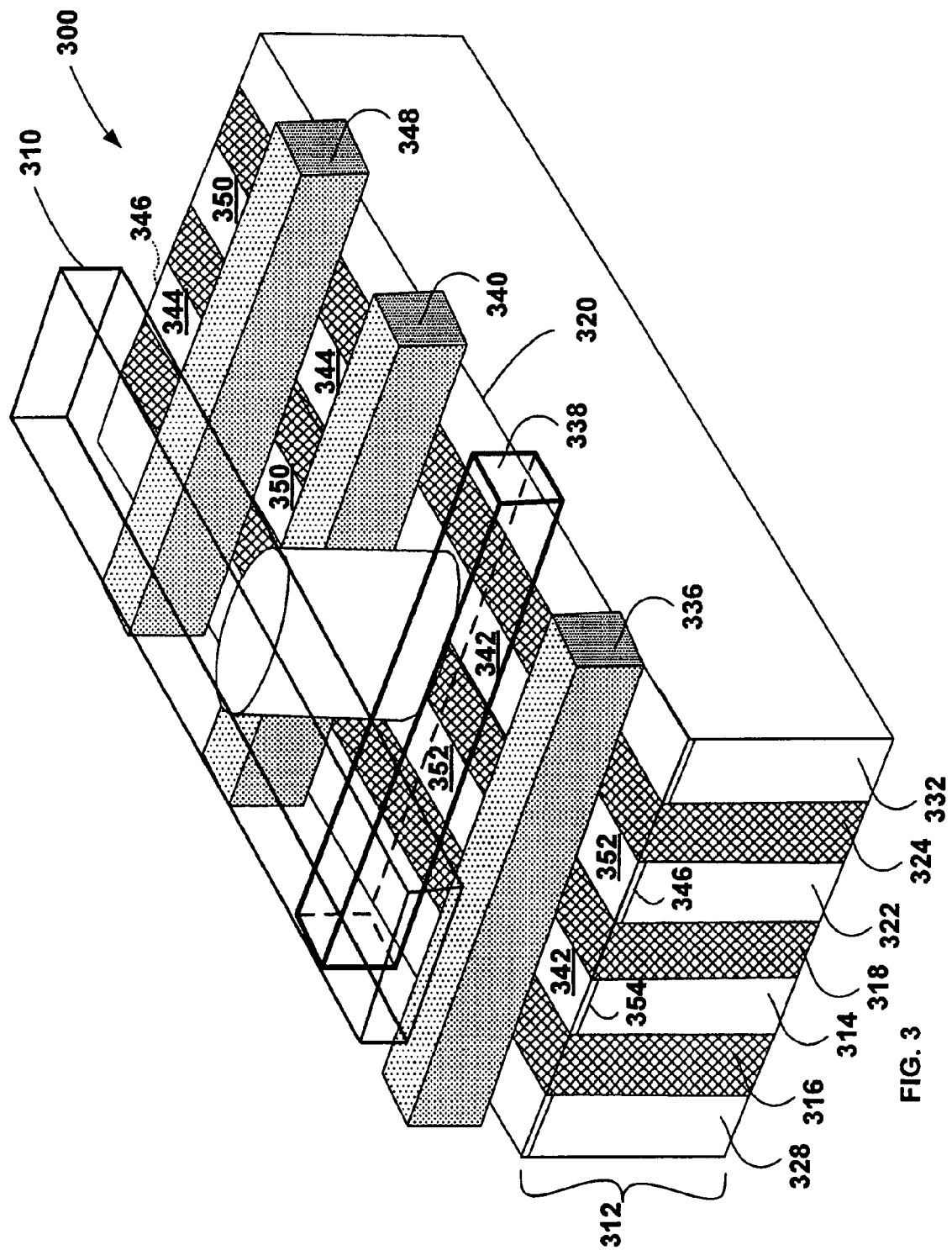
FIG. 3 is a cross-section and perspective elevation of a portion of a flash memory array according to an embodiment.

FIG. 3 is a cross-section and perspective elevation of a portion of a flash memory array 300 according to an embodiment. A bit line 310 is disposed above a semiconductor substrate 312. The bit line 310 is illustrated in wireframe to reveal structures behind and beneath it. The semiconductor substrate 312 includes semiconductive regions and non-semiconductive regions. A first active area string 314 is disposed between a first STI 316 and an intermediate STI 318. The first active area string 314 communicates with the bit line 310 through a contact 320. In other words, the first active area string 314 contacts the bit line 310 through the contact 320. A second active area string 322 is disposed between the intermediate STI 318 and a second STI 324. The second active area string 322 communicates with the bit line 310 also through the contact 320. In other words, the second active area string 322 contacts the bit line 310 through the contact 320. The contact 320 straddles the intermediate STI 318 and touches down on both the first active area string 314 and the second active area string 322. In other words, the contact 320 contacts both the first active area string 314 and the second active area string 322.

An active area string 328 is spaced apart from the first active area string 314 by the first STI 316. An active area string 332 is spaced apart from the second active area string 322 by the second STI 324.

A first select gate 336 is disposed above the semiconductor substrate 312, and it crosses perpendicular to the first active area string 314 and the second active area string 322. A second select gate 338 is also disposed above the semiconductor substrate 312, and it crosses perpendicular to the first active area string 314 and the second active area string 322. The second select gate 338 is illustrated in wireframe and phantom lines in order to reveal structures behind and below it. A third select gate 340 is disposed above the semiconductor substrate 312, and it also crosses perpendicular to the first active area string 314 and the second active area string 322. And a fourth select gate 348 is disposed above the semiconductor substrate 312, and it also crosses perpendicular to the first active area string 314 and the second active area string 322. Word lines that are used to access the flash memory array 300 are disposed parallel to the select gates and peripheral to the illustrated portions of the flash memory array 300.

In a process embodiment during fabrication of the flash memory array 300, the first active area string 314 may be processed to include a LVTR 342, a HVTR 344, a LVTR 350, and a HVTR 352. In an embodiment, formation of the LVTR 342 and 350, and the HVTR 344 and 352 is accomplished by first forming a HVTR gate oxide layer 346, which is depicted with a dashed reference line because it has depth below the HVTR 344. The HVTR gate oxide layer 346 may be blanket formed. Subsequently, selected portions of the HVTR gate oxide layer 346 is masked and an etch is carried out in the unmasked spaces to thin the HVTR gate oxide layer 346 such that a LVTR gate oxide layer 354 is formed for the LVTR 342 and 350.

In an embodiment, the HVTR gate oxide layer 346 and the LVTR gate oxide layer 354 are substantially equivalent in thickness, but the LVTR 342 and 350, and the HVTR 344 and 352 are differently doped to allow induced semiconductance at different selected gate voltages. The second active area string 322 likewise depicts LVTR 342 and 350 and HVTR 344 and 352.

In a method embodiment, the first active area string 314 is read at the LVTR 342. In this method embodiment, although the bit line 310 is electrically coupled to all of the accesses in both the first active area string 314 and the second active area string 322, the bit line 310 only reads the first active area string 314 at the LVTR 342. This method is accomplished by activating the requisite word line, activating the first select gate 336 at the requisite low voltage, and activating the second select gate 338 at the requisite high voltage. The respective third and fourth select gates 340 and 348 are not activated and consequently neither the HVTR 344 nor the LVTR 350 are able to give up their data. The first active area string 314, however, gives up its information at the LVTR 342. But the second active area string 322 does not give up its data at the HVTR 352 because the first select gate 336 was activated only at the requisite low voltage.

Figure 4:
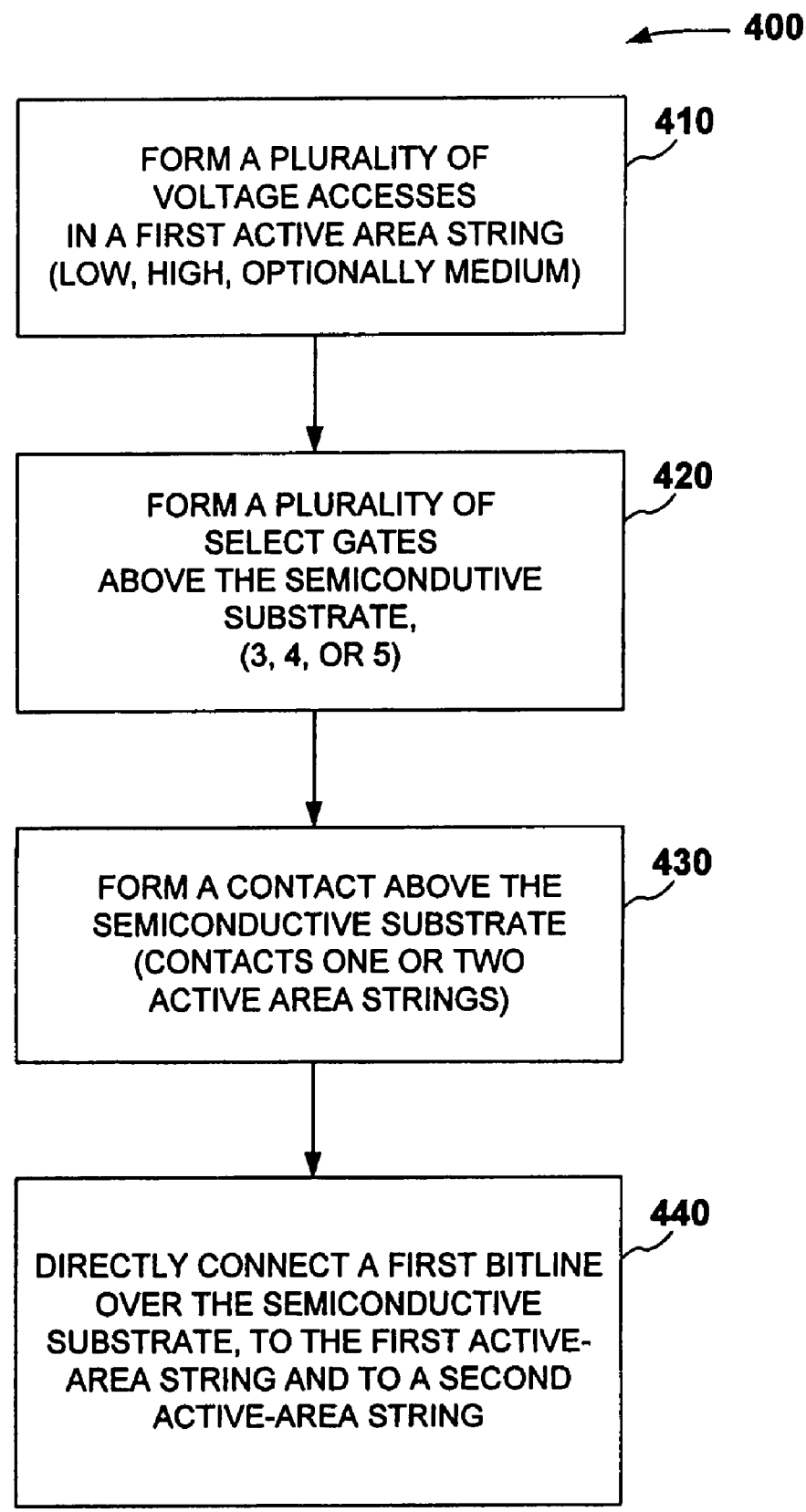
FIG. 4 is a process flow diagram that illustrates selected process embodiments.

FIG. 4 is a process flow diagram 400 that illustrates selected process embodiments.

At 440, the process may include directly connecting a first bit line over a semiconductive substrate, to a first active area string and to a second active area string. In an embodiment, the process commences and terminates at 440.

At 410, the process may include forming a plurality of voltage accesses in the first active-area string. In an embodiment, the plurality of voltage accesses is two: a high and a low. In a non-limiting example, the LVTR 142 is formed and the HVTR 144 is formed, either by etching the gate oxide layer 148 or by relative doping, as illustrated in FIG. 1. In an embodiment, the plurality of voltage accesses is three; a high, a medium, and a low.

At 420, the process may include forming a plurality of select gates above the semiconductive substrate. The number of the plurality can range from three to five, as respectively illustrated in FIGS. 1, 2 and 3.

At 430, the process may include forming a contact above the semiconductive substrate. In an embodiment, the contact may contact the first active area string and the second active area string as illustrated in FIG. 3.

Though they are both non-volatile flash memory technologies, NAND and NOR flash meet different design needs based on their individual attributes. NOR flash is faster with read and random access, which makes it useful for code storage in devices such as personal digital assistants (PDAs) and cell phones. NOR flash, however is slower with write and erase functions compared to NAND flash. NOR flash also has a larger memory cell size than NAND flash. NAND flash on the other hand, offers fast write/erase capability. NAND is therefore typically used for storing large data blocks such as for MP3 players, multi-function cell phones, digital cameras and USB drives.

It should be noted that the methods described herein do not have to be executed in the order described, or in any particular order. Moreover, various activities described with respect to the methods identified herein can be executed in iterative, serial, or parallel fashion. In an embodiment, the process may commence at 410 and may terminate at 440.

FIGS. 5 through 10 illustrate other embodiments. The processes and structures that are achieved in the various embodiments are inventively applicable to a variety of devices and apparatuses. Specific systems can be made by process embodiments, and such systems may include an embodiment or embodiments of the structure. For example, a chip package can contain a relaxed-pitch architecture flash memory array according to an embodiment. In another embodiment, the relaxed-pitch architecture flash memory array is part of an electrical device that includes the semiconductor substrate in a chip package and the chip package is part of a memory module or part of a chipset. In another embodiment, the memory module is part of a DRAM memory module that is inserted into a host such as a motherboard or a digital computer. In another embodiment, specific systems can be made that include the relaxed-pitch architecture flash memory array. For example, a chip package may contain a substrate such as one set forth in this disclosure. In another embodiment, the relaxed-pitch architecture flash memory array is part of an electrical device that includes the semiconductor substrate in a chip package and the chip package is part of a memory module or part of a chipset. In another embodiment, the memory module is part of a flash DRAM memory module that is inserted into a host such as a motherboard or a digital computer. In another embodiment, the relaxed-pitch architecture flash memory array structure is part of an electronic system. In another embodiment, the relaxed-pitch architecture flash memory array is part of a flash memory device that in turn is part of a chipset such as a basic input-output system (BIOS) for an electrical device.

Figure 5:
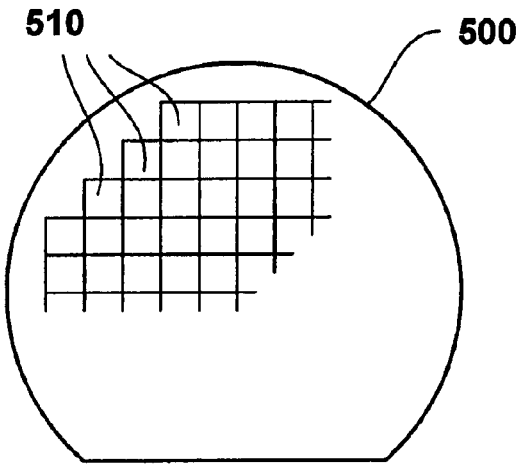
FIG. 5 is a top view of a semiconductor wafer or substrate containing semiconductive dies according to an embodiment.

FIG. 5 is a top view of a semiconductor wafer 500 or substrate containing semiconductor dice according to an embodiment. With reference to FIG. 5, a semiconductor die 510 is produced from the silicon wafer 500 that contains at least one of the relaxed-pitch architecture flash memory array structures depicted in FIGS. 1-3. A die 510 may comprise an individual pattern, typically rectangular, on a substrate such as substrate 112 (FIG. 1) or substrate 212 (FIG. 2) or semiconductor substrate 312 (FIG. 3) that contains circuitry to perform a specific function. A semiconductor wafer 500 will typically contain a repeated pattern of dice 510 containing the same functionality. The dice 510 can further contain additional circuitry to extend to such complex devices as a monolithic processor with multiple functionality. One or more dice 510 are typically packaged in a protective casing (not shown) with leads extending therefrom (not shown) providing access to the circuitry of individual dice 510 for unilateral or bilateral communication and control. In an embodiment, a die 510 is encased in a host such as a chip package (not shown) or a chip-scale package (CSP).

Figure 6:
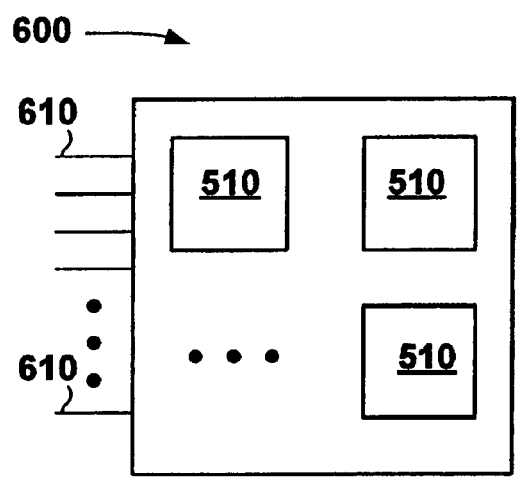
FIG. 6 is a block diagram of a circuit module according to an embodiment.

FIG. 6 is a block diagram of a circuit module 600 according to an embodiment. As shown in FIG. 6, two or more dice 510, at least one of which contains at least one relaxed-pitch architecture flash memory array structure similar to or identical to those depicted in FIGS. 1-3, respectively, in accordance with various embodiments may be combined, with or without protective casing, into a host such as a circuit module 600 to enhance or extend the functionality of an individual die 510. In an embodiment, the circuit module 600 may be a combination of dice 510 representing a variety of functions, or a combination of dice 510 containing the same functionality. Some examples of a circuit module 600 include memory modules, device drivers, power modules, communication modems, processor modules, and application-specific modules and can include multi-layer, multi-chip modules. In an embodiment, the circuit module 600 is a sub-component of a variety of electronic systems, such as a clock, a television, a cell phone, a personal computer, an automobile, an industrial control system, an aircraft, a hand-held device, and others. In an embodiment, the circuit module 600 has a variety of leads 610 extending therefrom providing unilateral or bilateral communication and control.

Figure 7:
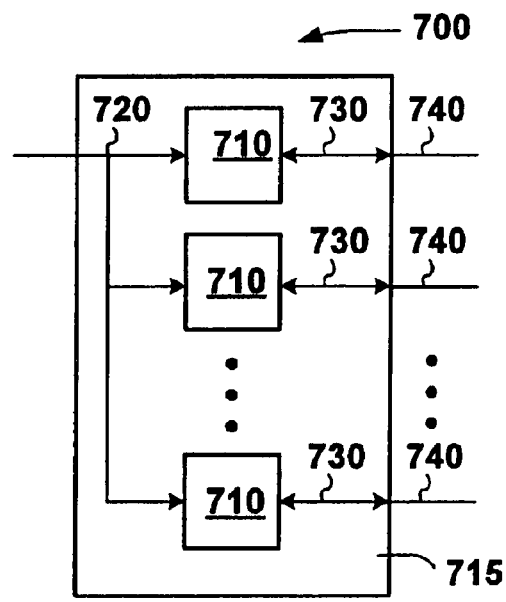
FIG. 7 is a block diagram of a memory module according to an embodiment.

FIG. 7 is a block diagram of a memory module 700 according to an embodiment. FIG. 7 shows one embodiment of a circuit module as a memory module 700 containing a relaxed-pitch architecture flash memory array structure similar to or identical to those depicted in FIGS. 1-3. The memory module 700 is a host that generally depicts a Single In-line Memory Module (SIMM) or a Dual In-line Memory Module (DIMM). A SIMM or DIMM may generally be a printed circuit board (PCB) or other support containing a series of memory devices. While a SIMM will have a single in-line set of contacts or leads, a DIMM will have a set of leads on each side of the support with each set representing separate input/output (I/O) signals.

In an embodiment, the memory module 700 is a flash memory card. In an embodiment, the memory module 700 is a flash memory card that is portable and connectable though a universal serial bus (USB) drive port. The memory module 700 contains multiple memory devices 710 contained on a support 715, the number depending upon the desired bus width and the desire for parity. In an embodiment, the memory module 700 contains memory devices 710 on both sides of the support 715. In an embodiment, the memory module 700 accepts a command signal from an external controller (not shown) on a command link 720 and provides for data input and data output on data links 730. The command link 720 and data links 730 are connected to leads 740 extending from the support 715. The leads 740 are shown for conceptual purposes and are not limited to the positions shown in FIG. 7.

Figure 8:
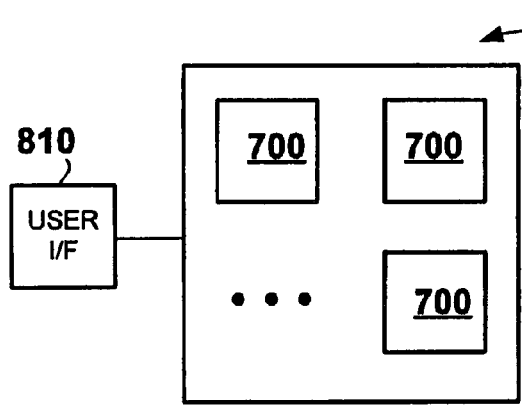
FIG. 8 is a block diagram of an electronic system according to an embodiment.

FIG. 8 is a block diagram of an electronic system 800 according to an embodiment. FIG. 8 shows another host type such as an electronic system 800 containing one or more memory modules 700, as described above, containing at least one relaxed-pitch architecture flash memory array structure embodiment. The electronic system 800 generally contains a user interface 810. The user interface 810 provides a user of the electronic system 800 with some form of control or observation of the results of the electronic system 800. Some examples of the user interface 810 include the keyboard, pointing device, monitor, and printer of a personal computer; the tuning dial, display, and speakers of a radio; the ignition switch or gas pedal of an automobile; and the card reader, keypad, display, and currency dispenser of an automated teller machine. The user interface 810 can further describe access ports provided to the electronic system 800. Access ports are used to connect an electronic system to the more tangible user interface components previously exemplified. One or more of the memory modules 700 can be a processor providing some form of manipulation, control or direction of inputs from or outputs to the user interface 810, or of other information either preprogrammed into, or otherwise provided to, the electronic system 800. As will be apparent from the lists of examples previously given, the electronic system 800 will often contain certain mechanical components (not shown) in addition to the memory modules 700 and the user interface 810. It will be appreciated that the one or more memory modules 700 in the electronic system 800 can be replaced by a single integrated circuit. Furthermore, the electronic system 800 may be a sub-component of a larger electronic system.

Figure 9:
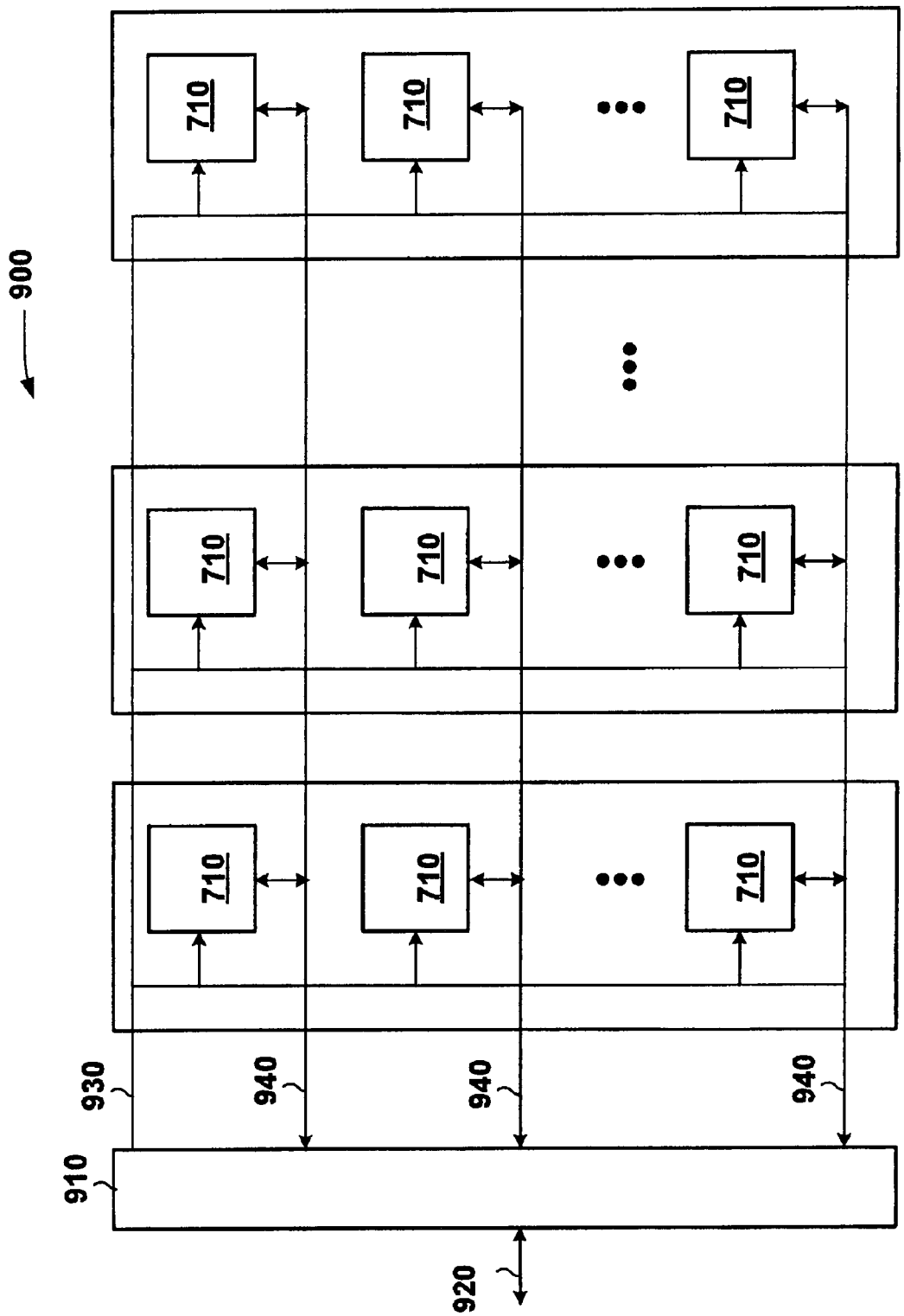
FIG. 9 is a block diagram of a memory system according to an embodiment.

FIG. 9 is a block diagram of a memory system 900 according to an embodiment. The memory system 900 acts as a higher-level host that contains one or more memory devices 710 as described above, including at least one relaxed-pitch architecture flash memory array structure embodiment, and a memory controller 910 that can also include circuitry that is connected with a buried digit line structure as set forth herein. The memory controller 910 provides and controls a bidirectional interface between the memory system 900 and an external system bus 920. The memory system 900 accepts a command signal from the external system bus 920 and relays it to the one or more memory devices 710 on a command link 930. The memory system 900 provides for data input and data output between the one or more memory devices 710 and the external system bus 920 on data links 940.

Figure 10:
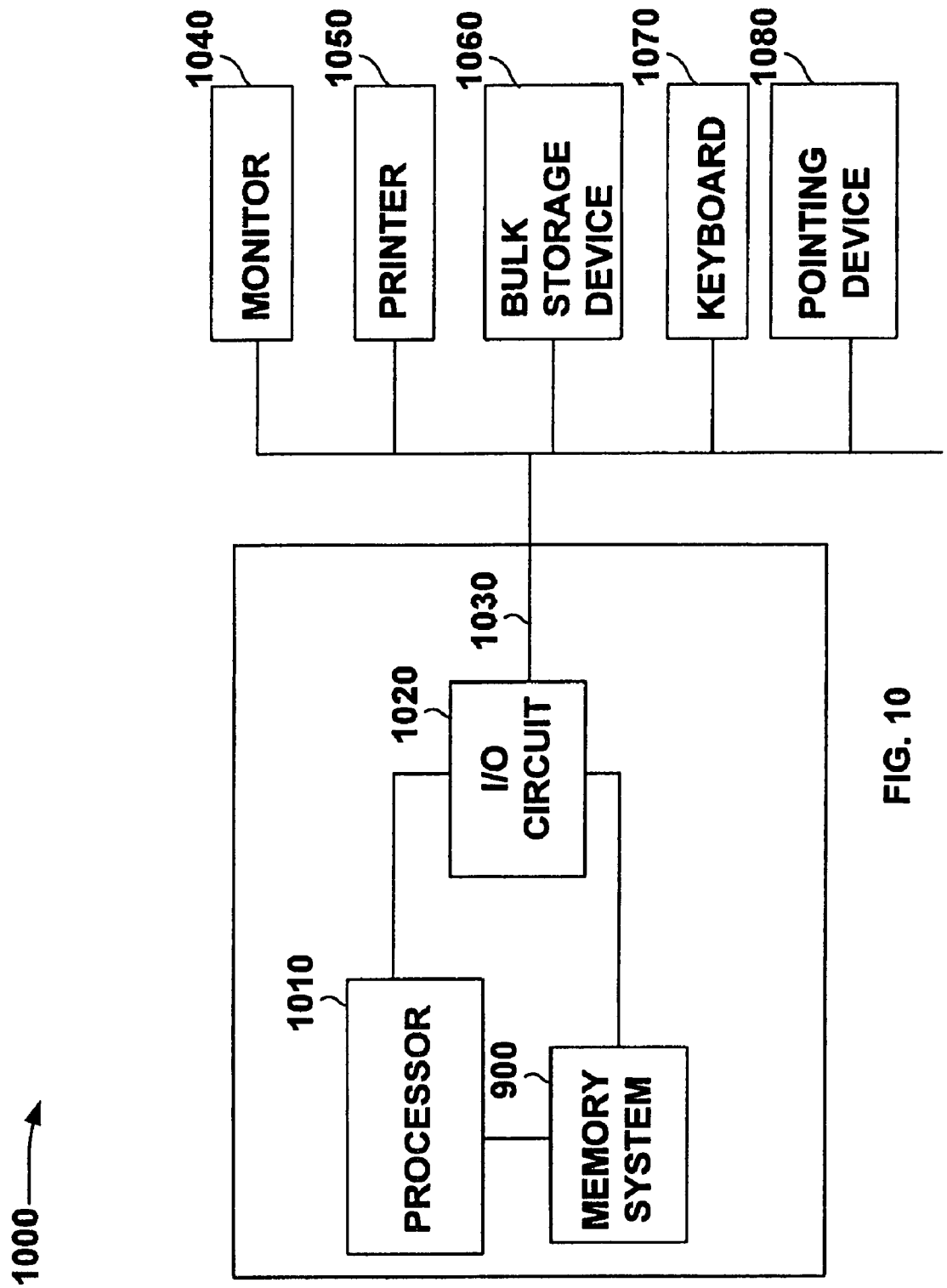
FIG. 10 is a block diagram of a computer system according to an embodiment.

FIG. 10 is a block diagram of a computer system 1000 according to an embodiment The computer system 1000 contains a processor 1010 and a memory system 900 as described above, housed in a computer unit 1015. The computer system 1000 is but one example of an electronic system containing another electronic system (i.e. the memory system 900, as a sub-component). In an embodiment, the computer system 1000 contains an I/O circuit 1020 that is coupled to the processor 1010 and the memory system 900. In an embodiment, the computer system 1000 contains user interface components that are coupled to the I/O circuit 1020. In an embodiment, a plurality of relaxed-pitch architecture flash memory array structures is coupled to one of a plurality of I/O pads or pins 1030 of the I/O circuit 1020. The I/O circuit 1020 can then be coupled to at least one of a monitor 1040, a printer 1050, a bulk storage device 1060, a keyboard 1070 and a pointing device 1080. It will be appreciated that other components are often associated with the computer system 1000 such as modems, device driver cards, additional storage devices, etc. It will further be appreciated that the processor 1010, the memory system 900, the I/O circuit 1020, and partially isolated structures or data storage devices of computer system 1000 can be incorporated on a single integrated circuit. Such single package processing units may reduce the communication time between the processor 1010 and the memory system 1000.

This Detailed Description refers to the accompanying drawings that show, by way of illustration, specific aspects and embodiments in which the present disclosure may be practiced. These embodiments are described in sufficient detail to enable those skilled in the art to practice the disclosed embodiments. Other embodiments may be utilized and structural, logical, and electrical changes may be made without departing from the scope of the present disclosure. The various embodiments are not necessarily mutually exclusive, as some embodiments can be combined with one or more other embodiments to form new embodiments.

The term "horizontal" as used in this document is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The Detailed Description is, therefore, not to be taken in a limiting sense, and the scope of this disclosure is defined only by the appended claims, along with the full scope of equivalents to which such claims are entitled.

The Abstract is provided to comply with 37 C.F.R. §1.72 (b), requiring an abstract that will allow the reader to quickly ascertain the nature of the technical disclosure. It is submitted with the understanding that it will not be used to interpret or limit the scope or meaning of the claims. In addition, in the foregoing Detailed Description, various features may be grouped together to streamline the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate embodiment.

What is claimed is:

1. A flash memory array comprising:
   a bit line;
   a first active area string, the first active area string having a low threshold voltage region and a high voltage threshold region; and
   a second active area string, wherein the bit line contacts the first active area string and the second active area string.

2. The flash memory array of claim 1, wherein the flash memory array includes transistors connected to the bit line.

3. The flash memory array of claim 2, wherein the bit line contacts a first contact and a second contact, wherein the first contact contacts the first active area string, wherein the first active area string includes the low threshold voltage region at a first side and the high voltage threshold region at a second side, wherein the second contact contacts the second active area string, and wherein the second active area string includes a low threshold voltage region at the second side and a high voltage threshold region at the first side.

4. The flash memory of claim 1, wherein the flash memory array includes less than three transistors connected to the bit line.

5. The flash memory array of claim 2, wherein the bit line contacts a first contact, wherein the first contact contacts the first active area string, and wherein the second active area string includes a low threshold voltage region and a high threshold voltage region.

6. The flash memory array of claim 1, wherein the flash memory array includes only two transistors connected to the bit line.

7. The flash memory array of claim 1, wherein the flash memory array includes different transistors connected to the bit line, further including select gates having different threshold voltages in the different transistors.

8. The flash memory array of claim 1, wherein the flash memory array includes five select gates coupled to the bit line.

9. The flash memory array of claim 1, wherein the bit line contacts a bit contact, and wherein the bit contact contacts the first active area string and the second active area string.

10. The flash memory array of claim 9, wherein the first active area string includes a sequence of accesses including low threshold voltage region and high threshold voltage region at a first side and high threshold voltage region and low threshold voltage region at a second side, and wherein the second active area string includes a sequence of accesses including low threshold voltage region and high threshold voltage region at a first side and high threshold voltage region and low threshold voltage at a second side.

11. The flash memory array of claim 1, wherein the flash memory array includes four select gates coupled to the bit line.

12. The flash memory array of claim 1, wherein the flash memory array is a NAND flash memory array.

13. A flash memory array comprising:
   a bit line, wherein the bit line is a first bit line that contacts a first contact and a second contact;
   a first active area string and a second active area string, wherein the bit line contacts the first active area string and the second active area string;
   five select gates coupled to the bit line; and
   a second bit line coupled to the five select gates, wherein the second bit line contacts a third contact and a fourth contact, wherein the third contact contacts a third active area string, and the forth contact contacts a fourth active area string.

14. A flash memory array comprising:
   a bit line, wherein the bit line is a first bit line that contacts a first contact and a second contact;
   a first active area string and a second active area string, wherein the bit line contacts the first active area string and the second active area string;
   five select gates coupled to the bit line; and
   a second bit line coupled to the five select gates, wherein the second bit line contacts a third contact and a fourth contact, wherein the first active area string includes a sequence of accesses including medium voltage threshold region and high voltage threshold region at a first side and high voltage threshold region and medium voltage threshold region at a second side, and the second active area string includes a sequence of accesses including low voltage threshold region and medium voltage threshold region at a first side and low voltage threshold region and medium voltage threshold region at a second side.

15. A process comprising:
   forming a flash memory array including forming a first bit line over a semiconductive substrate including a first active area string and a second active area string, wherein the first bit line contacts the first active area string and the second active area string; and
   forming the first active area string having a low threshold voltage region and a high voltage threshold region.

16. The process of claim 15, wherein select gates are formed over the active area strings.

17. The process of claim 15, further including:
   forming three select gates below the first bit line, wherein the first active area string contacts a first contact and the first contact contacts the first bit line, and wherein the second active area string contacts a second contact and the second contact contacts the first bit line.

18. The process of claim 15, wherein the second active area string is prepared by a process further including:
    forming a low threshold voltage region; and
    forming a high voltage threshold region.

19. The process of claim 15, wherein the first active area string includes a gate oxide, the process further including:
    forming the low threshold voltage region by etching the gate oxide; and
    forming the high voltage threshold region.

20. The process of claim 15, wherein the first active area string includes a gate oxide, the process further including:
    forming the low threshold voltage region by doping the semiconductive substrate differently than the high voltage threshold region.

21. The process of claim 15, further including forming five select gates below the first bit line, wherein the first active area string contacts a first contact and the first contact contacts the first bit line, and wherein the second active area string contacts a second contact and the second contact contacts the first bit line.

22. The process of claim 15, in the first active area string, the process further including:
    forming a medium voltage threshold region.

23. The process of claim 22, wherein the first active area string includes a gate oxide, the process further including:
    forming the low threshold voltage region by etching the gate oxide to a first amount; and
    forming the medium voltage threshold region to a second amount that is greater than the first amount.

24. The process of claim 22, wherein the first active area string includes a gate oxide, the process further including:
    forming the low threshold voltage region by doping the semiconductive substrate differently than either of the medium voltage threshold region and the high voltage threshold region.

25. The process of claim 22, further including forming four select gates below the first bit line, wherein the first active area string contacts a first contact and the first contact contacts the first bit line, and wherein the second active area string contacts the first contact.

26. The process of claim 15, in the second active area string, the process further including forming more than one threshold voltage region, wherein the more than one threshold voltage regions have different threshold voltages.

27. A computer system, comprising:
    a processor;
    a memory system coupled to the processor, the memory system including a flash memory array comprising:
        a bit line;
        a first active area string, the first active area string having a low threshold voltage region and a high voltage threshold region; and
        a second active area string, wherein the bit line contacts the first active area string and the second active area string; and
    an input/output (I/O) circuit coupled to the processor and the memory system.

28. The computer system of claim 27, wherein the first active area string is part of a NAND flash active area string.

29. The computer system of claim 27, wherein the flash memory array includes select gates selected from a group consisting of three select gates, four select gates, and five select gates, coupled to the bit line.

30. The computer system according to claim 27, wherein the processor is disposed in a host selected from a clock, a television, a cell phone, a personal computer, an automobile, an industrial control system, an aircraft, or a hand-held device.

31. The computer system according to claim 27, wherein the memory system is disposed in a host selected from a clock, a television, a cell phone, a personal computer, an automobile, an industrial control system, an aircraft, or a hand-held device.

* * * * *

UNITED STATES PATENT AND TRADEMARK OFFICE
CERTIFICATE OF CORRECTION

| | | |
|---|---|---|
| PATENT NO. | : 7,881,113 B2 | Page 1 of 1 |
| APPLICATION NO. | : 11/703487 | |
| DATED | : February 1, 2011 | |
| INVENTOR(S) | : Lyle D. Jones et al. | |

It is certified that error appears in the above-identified patent and that said Letters Patent is hereby corrected as shown below:

In column 10, line 12, in Claim 10, after "voltage" insert -- region --.

Signed and Sealed this
Fifth Day of April, 2011

David J. Kappos
*Director of the United States Patent and Trademark Office*